(12) United States Patent
Hsu et al.

(10) Patent No.: US 7,379,491 B2
(45) Date of Patent: May 27, 2008

(54) FLOP REPEATER CIRCUIT

(75) Inventors: Steven K. Hsu, Lake Oswego, OR (US); Ram K. Krishnamurthy, Portland, OR (US); Gian Gerosa, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 684 days.

(21) Appl. No.: 10/744,085

(22) Filed: Dec. 24, 2003

(65) Prior Publication Data

US 2005/0141599 A1 Jun. 30, 2005

(51) Int. Cl.
*H04B 3/36* (2006.01)

(52) U.S. Cl. ........................................ 375/211; 327/203

(58) Field of Classification Search ................ 327/211, 327/198, 203; 713/600; 375/211
See application file for complete search history.

(56) References Cited

U.S. PATENT DOCUMENTS

| | | | | |
|---|---|---|---|---|
| 4,032,911 A | * | 6/1977 | Melvin, Jr. ................. | 375/211 |
| 4,602,210 A | * | 7/1986 | Fasang et al. .............. | 714/731 |
| 5,155,382 A | * | 10/1992 | Madden et al. ............. | 327/203 |
| 5,612,632 A | * | 3/1997 | Mahant-Shetti et al. ...... | 326/46 |
| 5,680,415 A | * | 10/1997 | Hickman .................... | 375/211 |
| 6,240,139 B1 | * | 5/2001 | Cao et al. .................. | 375/257 |
| 6,564,335 B1 | * | 5/2003 | Freker ........................ | 713/600 |
| 6,588,001 B1 | * | 7/2003 | Porterfield .................... | 716/8 |
| 6,693,459 B2 | * | 2/2004 | Nedovic et al. .............. | 326/93 |
| 6,788,122 B2 | * | 9/2004 | Jones, Jr. .................... | 327/202 |
| 6,944,784 B2 | * | 9/2005 | Clark et al. ................. | 713/600 |
| 2002/0057602 A1 | * | 5/2002 | Huber ........................ | 365/194 |
| 2003/0133621 A1 | * | 7/2003 | Fujii et al. .................. | 382/257 |
| 2004/0047404 A1 | * | 3/2004 | Kim .......................... | 375/211 |
| 2004/0140835 A1 | * | 7/2004 | Lehmann et al. ........... | 327/208 |
| 2006/0013208 A1 | * | 1/2006 | Rietschel et al. ............ | 370/389 |

OTHER PUBLICATIONS

Ruibing Lu et al. "Flip Flop and Repeater Insertion for Early Interconnect Planning" Date no earlier than 2001.

* cited by examiner

*Primary Examiner*—David C. Payne
*Assistant Examiner*—Leon-Viet Q Nguyen
(74) *Attorney, Agent, or Firm*—Ked & Associates, LLP (57) ABSTRACT

A system is provided that includes a clocking circuit to provide two repeater clock signals and a flop repeater circuit to receive the two repeater clock signals and an input data signal. The flop repeater circuit to provide an output data signal based on the two repeater clock signals. The flop repeater circuit including a plurality of transistors and inverters coupled together to function as a flip-flop circuit that passes data without any full transmission gates.

19 Claims, 7 Drawing Sheets

FLOP REPEATER CIRCUIT

FIELD

Embodiments of the present invention may relate to repeater circuits. More particularly, embodiments of the present invention may relate to reducing a clocking power of a die by utilizing a repeater circuit.

BACKGROUND

Electronic devices, such as microprocessors, are steadily operating at faster and faster speeds. As microprocessors run at higher and higher speeds, the power delivered to the microprocessors by a power supply starts to become an issue. Power consumption has become a significant limiter in high-performance microprocessor design. The clock power of a microprocessor may be well above 60% of the entire microprocessor power. One of the largest components of power consumption is the clocking subsystem, including clock generation, distribution, and clocking power consumed in flop-flops and latches. As the clock frequency increases, many critical path delays are due to interconnects. Since more interconnects need to be pipelined, this may increase the clock power. Therefore, alternative circuit topologies to reduce the clock load need to be developed.

BRIEF DESCRIPTION OF THE DRAWINGS

The foregoing and a better understanding of the present invention will become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

In the following detailed description, like reference numerals and characters may be used to designate identical, corresponding or similar components in differing figure drawings. Further, in the detailed description to follow, example sizes/models/values/ranges may be given although the present invention is not limited to the same. Arrangements and embodiments may be shown in block diagram form in order to avoid obscuring the invention, and also in view of the fact that specifics with respect to implementation of such block diagram arrangements and embodiments may be dependent upon the platform within which the present invention is to be implemented. That is, the specifics are well within the purview of one skilled in the art. Where specific details are set forth in order to describe example embodiments of the invention, it should be apparent to one skilled in the art that the invention can be practiced without these specific details.

Further, while values or signals may be described as HIGH ("1") or LOW ("0"), these descriptions of HIGH and LOW are intended to be relative to the discussed arrangement and/or embodiment. That is, a value or signal may be described as HIGH in one arrangement although it may be LOW if provided in another arrangement. Arrangements and embodiments may also be described with respect to signals being input or output from different circuit components. It is understood that while the discussion identifies a signal, the signal may be transmitted over a signal line or similar type of mechanism. Further, the terminology signal may also correspond to a signal line as shown in the drawings. Additionally, while specific logical circuits may be shown and discussed, other combinations of logical circuits may be provided.

Embodiments of the present invention may include a clocking circuit to provide two repeater clock signals and a flop repeater circuit to receive the two repeater clock signals and an input data signal. The flop repeater circuit to provide an output data signal based on the two repeater clock signals. The flop repeater circuit including a plurality of transistors and inverters coupled together without any transmission gates to function as a flip-flop circuit that passes data.

Figure 1:
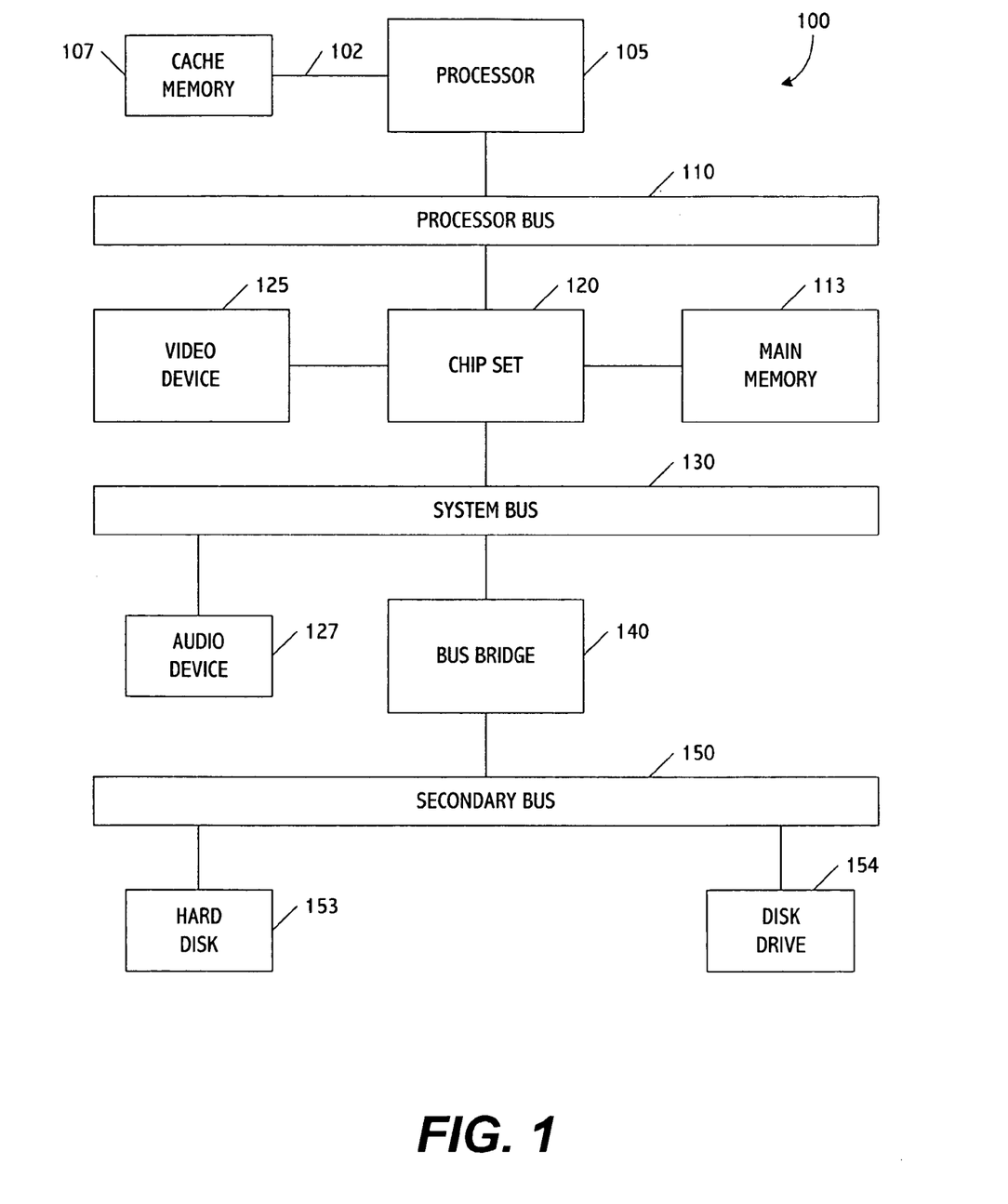
FIG. 1 is a block diagram of a computer system according to an example arrangement.

FIG. 1 is a block diagram of a computer system 100 according to an example arrangement. Other arrangements are also possible. A computer system 100 may include a processor 105 coupled to a processor bus 110. The processor 105 may include a first level (L1) cache memory (not shown in FIG. 1).

The processor 105 may also be coupled to a cache memory 107, which is a second level (L2) cache memory, via a dedicated cache bus 102. The L1 and L2 cache memories can also be integrated into a single device. Alternatively, the cache memory 107 may be coupled to the processor 105 by a shared bus.

A chip set 120 may also be coupled to the processor bus 110. The chip set 120 may include a memory controller for controlling a main memory 113. Further, the chip set 120 may be coupled to a video device 125 that handles video data requests to access the main memory 113. The video device 125 may include a video monitor such as a cathode ray tube (CRT) or liquid crystal display (LCD) and necessary support circuitry.

The main memory 113 may be coupled to the processor bus 110 through the chip set 120. The main memory 113 and the cache memory 107 may store sequences of instructions that are executed by the processor 105. The main memory 113 may include a Rambus dynamic random access memory (RDRAM) system or the main memory 113 may have other configurations. The sequences of instructions executed by the processor 105 may be retrieved from the main memory 113, the cache memory 107, or any other storage device. Additional devices may also be coupled to the processor bus 110, such as multiple processors and/or multiple main memory devices. The computer system 100 is described in terms of a single processor; however, multiple processors can be coupled to the processor bus 110.

The processor bus 110 may be coupled to a system bus 130 by the chip set 120. The system bus 130 may be a Peripheral Component Interconnect (PCI) bus adhering to a Specification Revision 2.1 bus developed by the PCI Special Interest Group of Portland, Oreg.; however, other bus standards may also be used. Multiple devices, such as an audio device 127, may be coupled to the system bus 130.

A bus bridge 140 may couple the system bus 130 to a secondary bus 150. For example, the secondary bus 150 may be an Industry Standard Architecture (ISA) Specification Revision 1.0a bus developed by International Business Machines of Armonk, N.Y. However, other bus standards may also be used, for example Extended Industry Standard Architecture (EISA) Specification Revision 3.12 developed by Compaq Computer, et al. Multiple devices, such as a hard disk 153 and a disk drive 154 may be coupled to the secondary bus 150. Other devices, such as cursor control devices (not shown in FIG. 1), may be coupled to the secondary bus 150.

The computer system 100 described above (or other electronic devices/systems) may include one or more chips (also referred to as chipsets or dies) within various components or forming one or more of the components. In disadvantageous arrangements, long interconnects traversing across a die (or between dies) may incur a substantial delay due to large RC (i.e., resistance×capacitance) values that impede a signal traveling from a source to a destination. These delays affect a maximum speed at which an entire chip may operate. Repeater circuits may be provided to aid in these problems.

Figure 2:
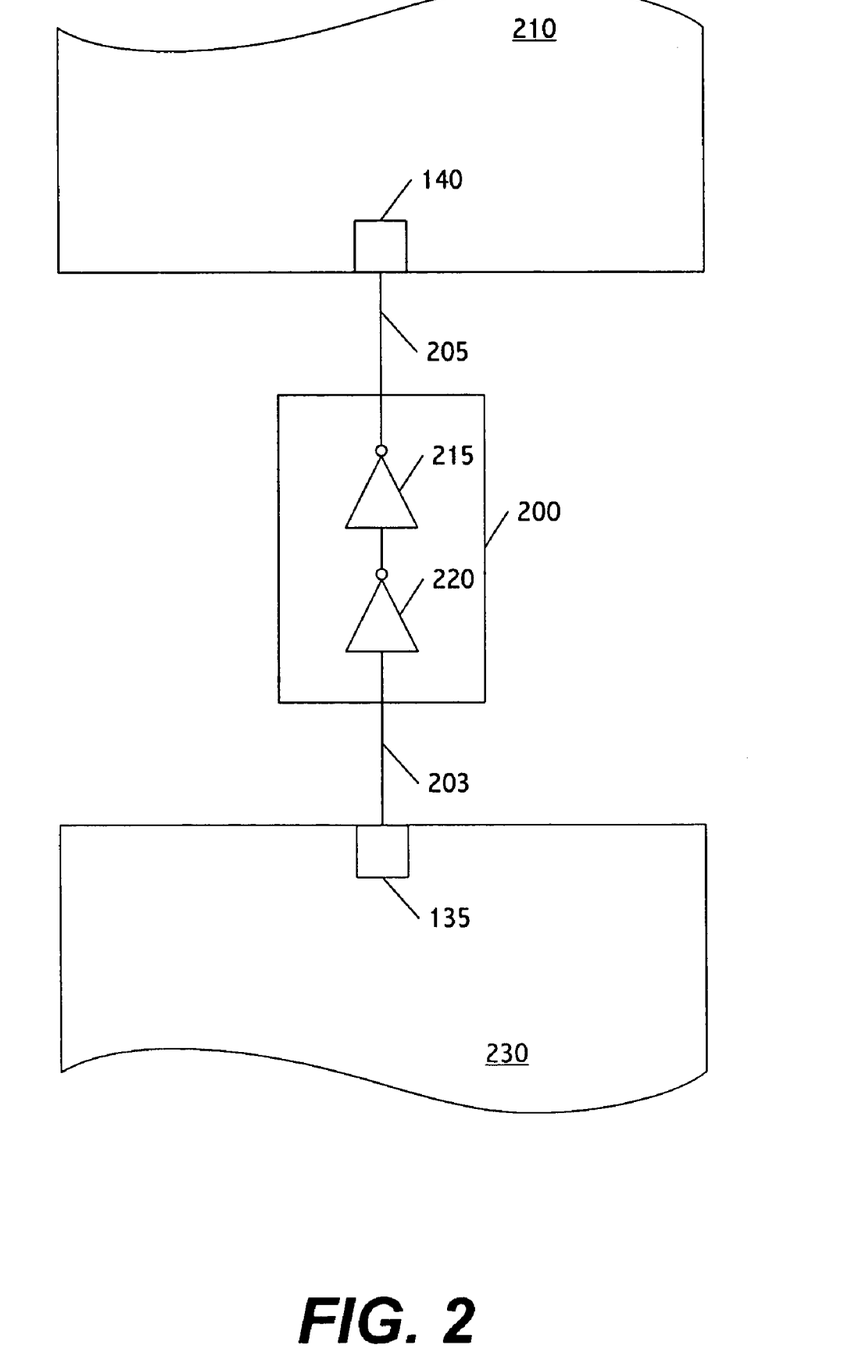
FIG. 2 illustrates a repeater circuit between two functional blocks according to an example arrangement.

FIG. 2 illustrates a repeater circuit between two functional blocks according to an example arrangement. Other arrangements are also possible. More specifically, FIG. 2 shows a repeater circuit (or repeater cell) 200 within a length of interconnect between a functional block 210 and a functional block 230 both provided on a chip (or die). The functional block 230 may include a source (or source driver) 135 and the functional block 210 may include a destination (or destination element) 140. The repeater circuit 200 may be provided to break up the long interconnect length between the functional blocks 210 and 230. That is, the source 135 may drive a length of interconnect 203 and the repeater 200 may drive a length of interconnect 205 to the destination 140. The repeater 200 allows a signal to propagate faster because long wires incur non-linear delays. The repeater 200 may serve to boost the signal strength, allowing a signal to traverse larger distances with less propagation delay. In this arrangement, the repeater 200 includes two inverters 220 and 215. The repeater 200 first inverts the control signal using the inverter 220, then inverts the control signal again using the inverter 215 to arrive at the original signal; however, the original signal is refreshed by the repeater 200.

Figure 3:
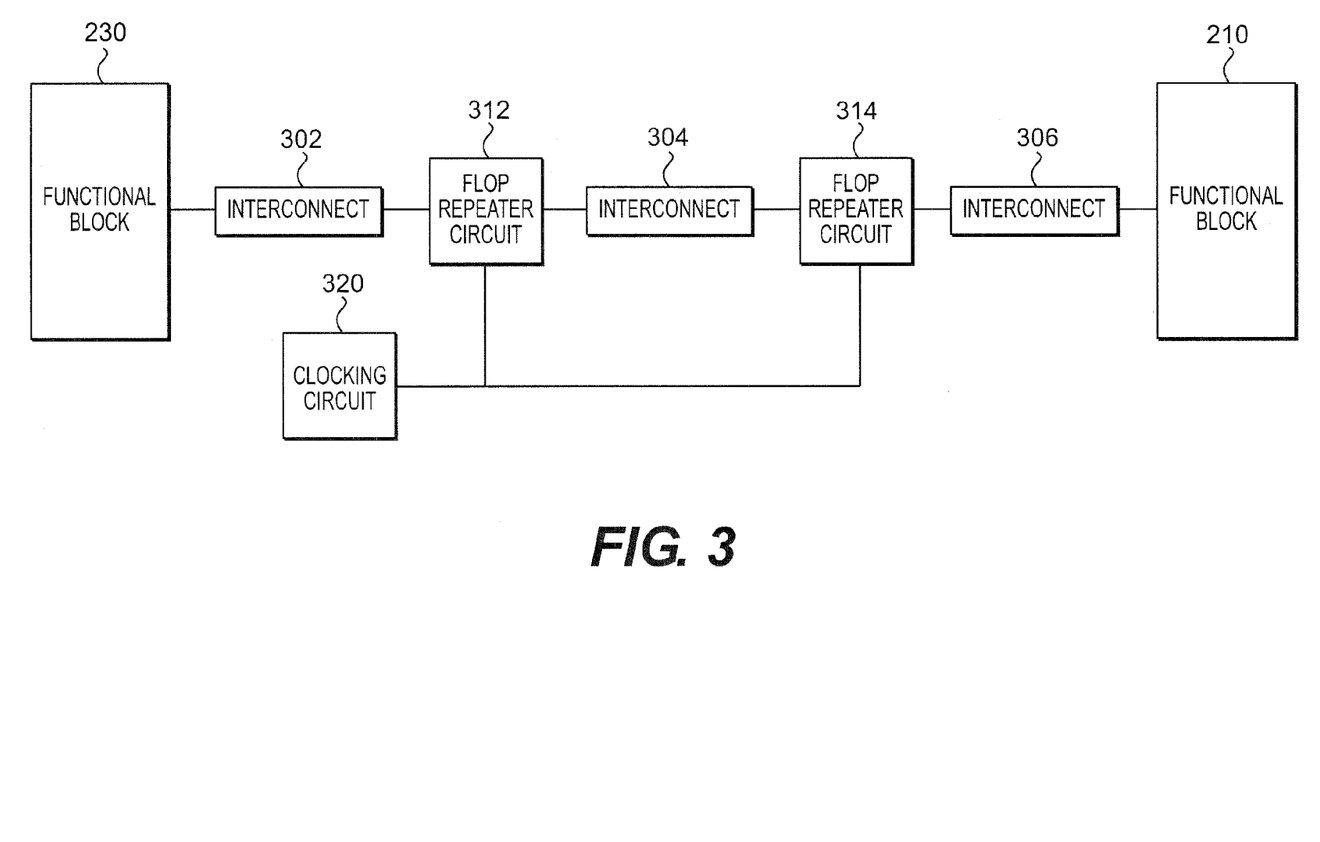
FIG. 3 illustrates a bus and repeater architecture according to an example arrangement.

FIG. 3 illustrates a bus and repeater architecture according to an example arrangement. Other arrangements are also possible. More specifically, FIG. 3 shows an arrangement of interconnects (or bus elements) and flop repeater circuits that may be provided on a die or chip. Similar as discussed above, this architecture may be used between the functional block 230 and the functional block 210 provided on a chip. As shown, an interconnect 302 may be coupled to the functional block 230 so as to receive signals. The interconnect 302 may be further coupled to a flop repeater circuit 312 (or a flip-flop repeater circuit). The flop repeater circuit 312 may also be coupled to an interconnect 304, which in turn may be further coupled to a flop repeater circuit 314 (or flip-flop repeater circuit). The flop repeater circuit 314 may also be coupled to an interconnect 306, which is further coupled to the functional block 210. Other numbers of flop repeater circuits and/or interconnects are also possible. The flop repeater circuit 312 may drive signals on the interconnect 304 to the flop repeater circuit 314. The flop repeater circuit 314 may further drive signals on the interconnect 306 to the functional block 210. Although this arrangement has been described as a signal (or signals) traveling from the functional block 230 to the functional block 210, this arrangement may also operate such that a signal (or signals) travels from the functional block 210 to the functional block 230.

FIG. 3 also shows a clocking circuit (or clocking device) 320 that may provide a global clock signal to each of the flop repeater circuits 312 and 314 (as well as other flop repeater circuits or other elements located on the chip). The global clock signal may be used to appropriately drive certain elements of these and other circuits on the chip.

Figure 4A:
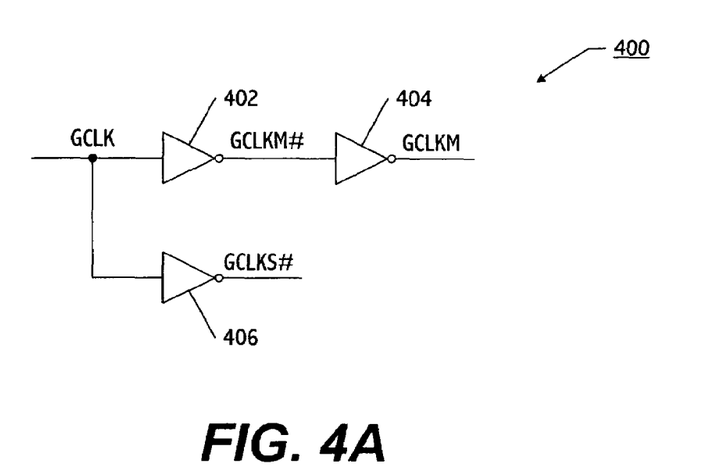
FIG. 4A illustrates a clocking circuit according to an example arrangement.

FIG. 4A illustrates a clocking circuit 400 according to an example arrangement. Other arrangements are also possible. More specifically, FIG. 4A shows the clocking circuit 400 to provide global clock signals to various flop repeater circuits and possibly other elements on the die or chip. That is, the clocking circuit 400 may correspond to the clocking circuit 320 shown in FIG. 3. In this arrangement, the clocking circuit 400 includes inverters 402, 404 and 406. As shown, a global clock signal gclk may be input to each of the inverters 402 and 406. The inverter 402 outputs the signal gclkm# to the inverter 404. The inverter 404 thereby outputs a global master clock signal gclkm. The inverter 406 outputs the global slave clock signal gclks#. Each of, or some of, the signals gclk, gclkm, gclkm# and gclks# may be applied to various flop repeater circuits located throughout the chip so as to appropriately pass data (or clock data) through the flop repeater circuits.

Figure 4B:
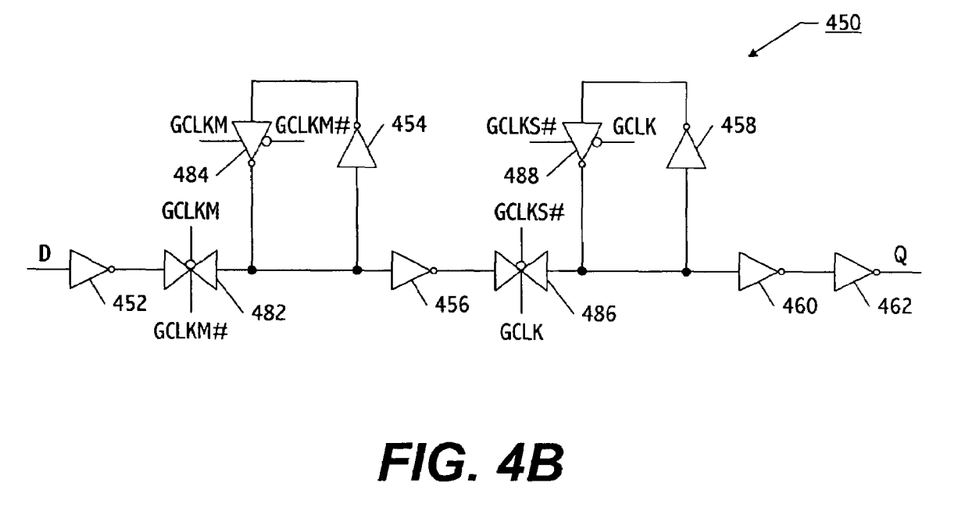
FIG. 4B illustrates a flop repeater circuit (for use with the FIG. 4A clocking circuit) according to an example arrangement.

FIG. 4B illustrates a flop repeater circuit 450 for use with the clocking circuit 400 according to an example arrangement. Other arrangements are also possible. Elements of the flop repeater circuit 450 may be driven (or clocked) by the signals discussed above with respect to the clocking circuit 400 shown in FIG. 4A. In particular, the flop repeater circuit 450 may include inverters 452, 454, 456, 458, 460 and 462. The flop repeater circuit 450 may further include transmission gates 482, 484, 486 and 488 that are coupled together with the inverters as shown in FIG. 4B. As is known in the art, transmission gates include NMOS and PMOS transistors coupled in parallel. Each of the transmission gates 482, 484, 486 and 488 operate based on two clock signals, which results in a reduction of the overall clocking power.

Elements of the left hand side of FIG. 4B may be considered on the "master" side of the flop repeater circuit 450 and elements on the right hand side of FIG. 4B may be considered on the "slave" side of the flop repeater circuit 450. Thus, the flop repeater circuit 450 acts as a master/slave D/Q flip-flop circuit as is known in the art. That is, data D is input to the flop repeater circuit 450 and the data Q is output from the flop repeater circuit 450 based on the clocking signals applied to the transmission gates 482, 484, 486 and 488.

The flop repeater circuit 450 operates based on various clock signals that are applied to the various transmission gates 482, 484, 486 and 488. These clock signals may be generated by the clocking circuit 400 shown in FIG. 4A. More specifically, the transmission gate 482 operates based on the signals gclkm and gclkm#. The transmission gate 484 operates based on the clock signals gclkm and gclkm#. Further, the transmission gate 486 operates based on the signals gclk and gclks#. The transmission gate 488 operates based on the signals gclk and gclks#. Accordingly, the flop repeater circuit 450 shown in FIG. 4B operates based on four clock signals (gclkm, gclkm#, gclk and gclks#) so as to drive signals through the flop repeater circuit 450. These four clock signals correspond to the signals shown in FIG. 4A. As stated above, the clocking circuit requires the generation of several clock signals (in this case four clock signals), which may reduce the overall clocking power of the die. Therefore, it is desirable to reduce the number of generated clock signals in order to conserve power.

Figure 5A:
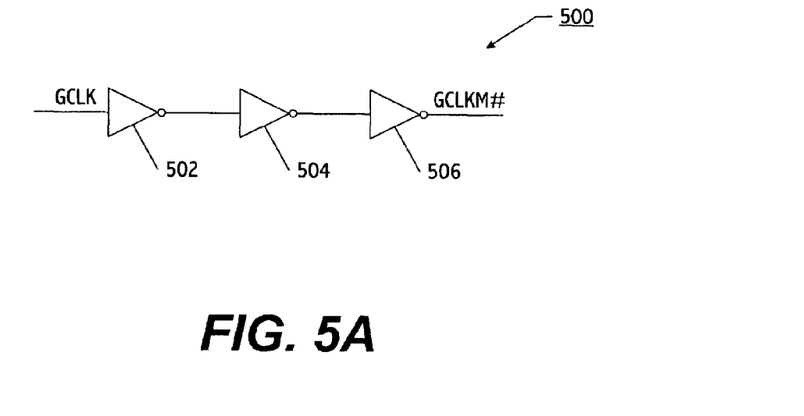
FIG. 5A illustrates a clocking circuit according to an example embodiment of the present invention.

FIG. 5A illustrates a clocking circuit 500 according to an example embodiment of the present invention. Other embodiments and configurations are also within the scope of the present invention. More specifically, the clocking circuit 500 includes inverters 502, 504 and 506. The clocking circuit 500 operates such that the global clock signal gclk is input to the inverter 502 and the inverted signal is output to the inverter circuit 504, which in turn outputs a signal to the inverter circuit 506. The inverter circuit 506 outputs the global clock signal gclkm#. The global clock signal gclkm# may be applied to various flop repeater circuits located throughout the chip so as to appropriately pass data through the flop repeater circuits.

Figure 5B:
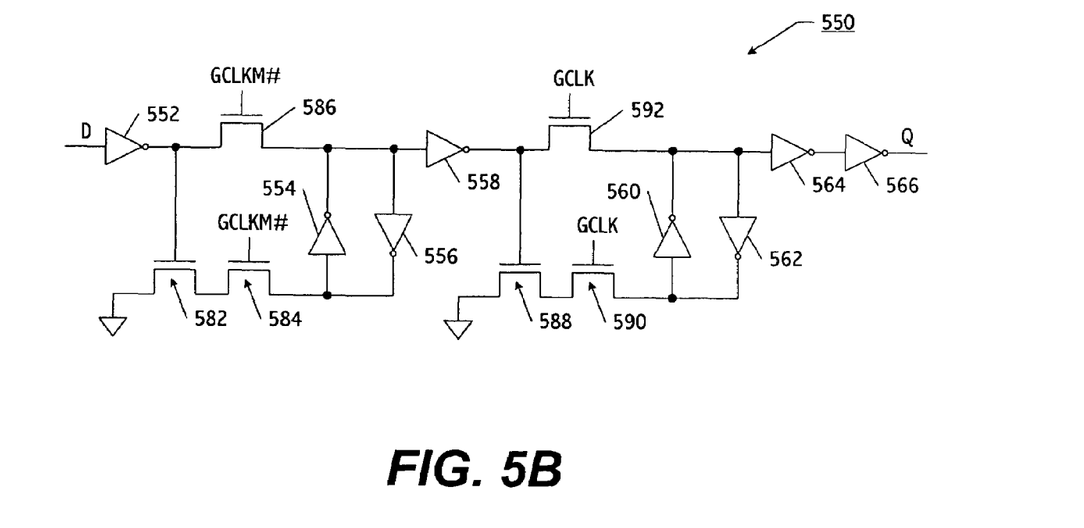
FIG. 5B illustrates a flop repeater circuit (for use with the FIG. 5A clocking circuit) according to an example embodiment of the present invention.

FIG. 5B illustrates a flop repeater circuit 550 (or flip-flop repeater circuit) for use with the clocking circuit 500 according to an example embodiment of the present invention. Other embodiments and configurations are also within the scope of the present invention. The flop repeater circuit 550 shown in FIG. 5B does not include transmission gates (having the parallel NMOS and PMOS transistors) and therefore there is a significant reduction in clock capacitance as compared to the arrangement shown in FIG. 4B. More specifically, the flop repeater 550 operates without the use of full transmission gates. The flop repeater circuit 550 may include inverters (or inverter circuits) 552, 554, 556, 558, 560, 562, 564 and 566. The flop repeater circuit 550 further includes NMOS transistors 582, 584, 586, 588, 590 and 592 that are coupled with the inverters as shown in FIG. 5B. The flop repeater circuit 550 does not include any full transmission gates and therefore a less number of clock signals are needed. This results in a less reduction of the clocking power as compared with arrangements having full transmission gates.

Elements on the left hand side of FIG. 5B may be considered on the "master" side of the flop repeater circuit 550 and elements on the right hand side of FIG. 5B may be considered on the "slave" side of the flop repeater circuit 550. Thus, the flop repeater circuit 550 acts as a master/slave D/Q flip-flop circuit. That is, data D is input to the flop repeater circuit 550 and data Q is output from the flop repeater circuit 550 based on the clocking signals applied to the transistors without requiring full transmission gates.

The flop repeater circuit 550 operates based on various signals that are applied to the various transistors 584, 586, 590 and 592. These signals may be generated (or provided) by the clocking circuit 500 shown in FIG. 5A. More specifically, the transistor 584 operates based on the signal gclkm# and the transistor 586 operates based on the signal gclkm#. Furthermore, the transistor 590 operates based on the signal gclk and the transistor 592 operates based on the signal gclk. The transistor 582 operates based on a signal output from the inverter 552 and the transistor 588 operates based on a signal output from the inverter 558. Accordingly, the flop repeater circuit 550 is capable of passing signals from a D input to a Q output based on the two clock signals gclkm# and gclk. Thus, there is a reduction in the number of generated clock signals as compared to the FIG. 4A/4B example arrangement (i.e., two clock signals as compared with four clock signals). This may reduce the overall clocking power of the die as compared with the FIG. 4A/4B example arrangement.

Accordingly, the clocking circuit 500 and flop repeater circuit 550 shown in FIGS. 5A and 5B show that adding more transparency period between master and slave sides (or latches) may create a skew tolerant version. This may be accomplished by having a three inverter delay in the clocking circuit 500 between the input of the clock signal gclk and the output of the clock signal gclkm#. Thus, the structure of the clocking circuit 500 and the flop repeater circuit 550 includes a time-borrowing feature. Time-borrowing allows data to be less sensitive to clock variations or jitter.

Figure 6:
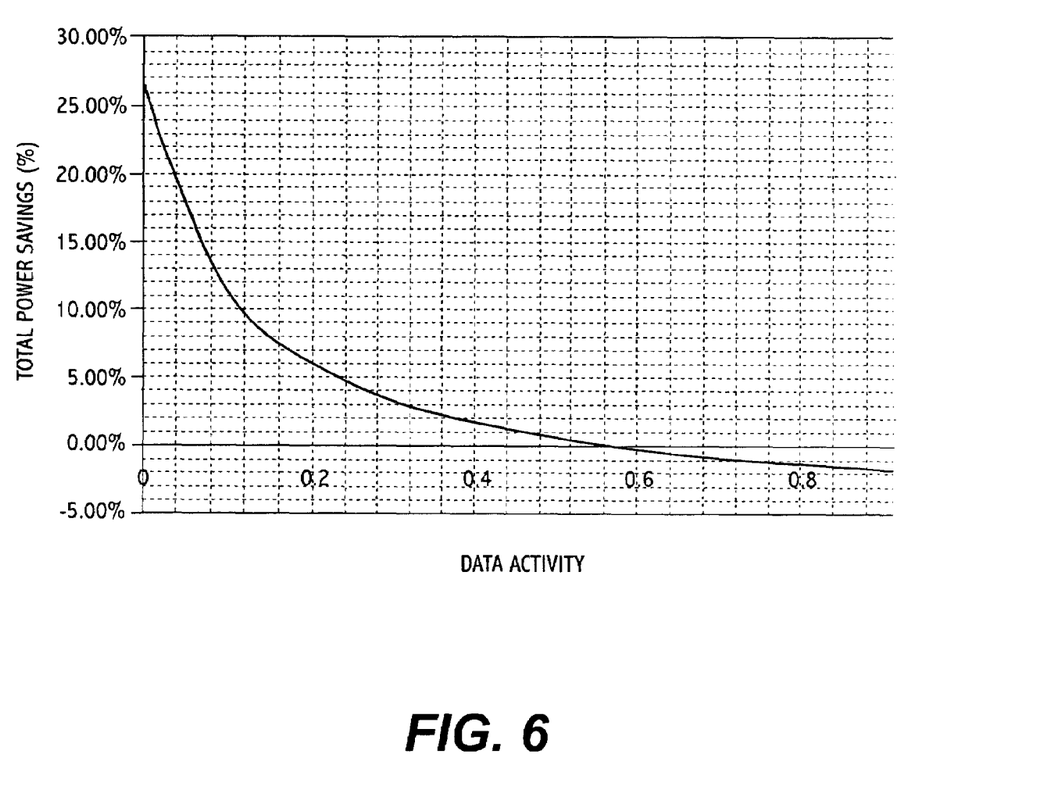
FIG. 6 is a graph illustrating power savings according to an example embodiment of the present invention.

FIG. 6 is a graph illustrating power savings according to an example embodiment of the present invention. Other graphs, indications and embodiments are also within the scope of the present invention. More specifically, FIG. 6 shows a total power savings on a vertical axis and an amount of data activity on a horizontal axis. This graph is used to show power savings of the FIG. 5B flop repeater circuit as compared to the FIG. 4B flop repeater circuit. The curve in FIG. 6 shows approximately a 26% power savings (when zero data activity) utilizing the FIG. 5B flop repeater circuit 550 as compared to the amount of savings for the FIG. 4B flop repeater circuit. The amount of power savings decreases as the amount of data activity increases, as shown by the curve sloping towards the right.

Figure 7A:
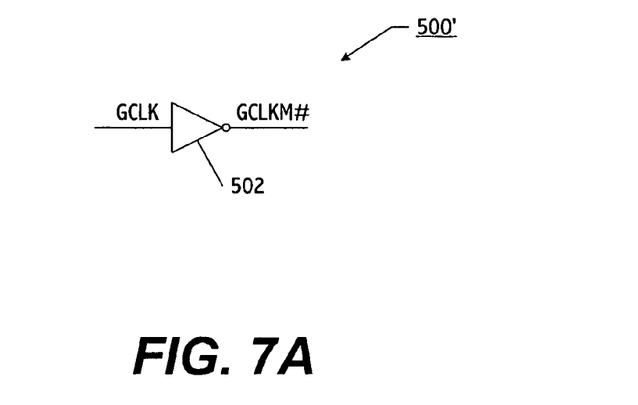
FIG. 7A illustrates a clocking circuit according to an example embodiment of the present invention.

FIG. 7A illustrates a clocking circuit 500' according to an example embodiment of the present invention. Other embodiments and configurations are also within the scope of the present invention. More specifically, the clocking circuit 500' includes a single inverter 502. The clocking circuit 500' operates such that the global clock signal gclk is input to the inverter 502. The inverter 502 outputs the global clock signal gclkm#. The global clock signal gclkm# may be applied to various flop repeater circuits located throughout the chip so as to appropriately pass data through the flop repeater circuits.

Figure 7B:
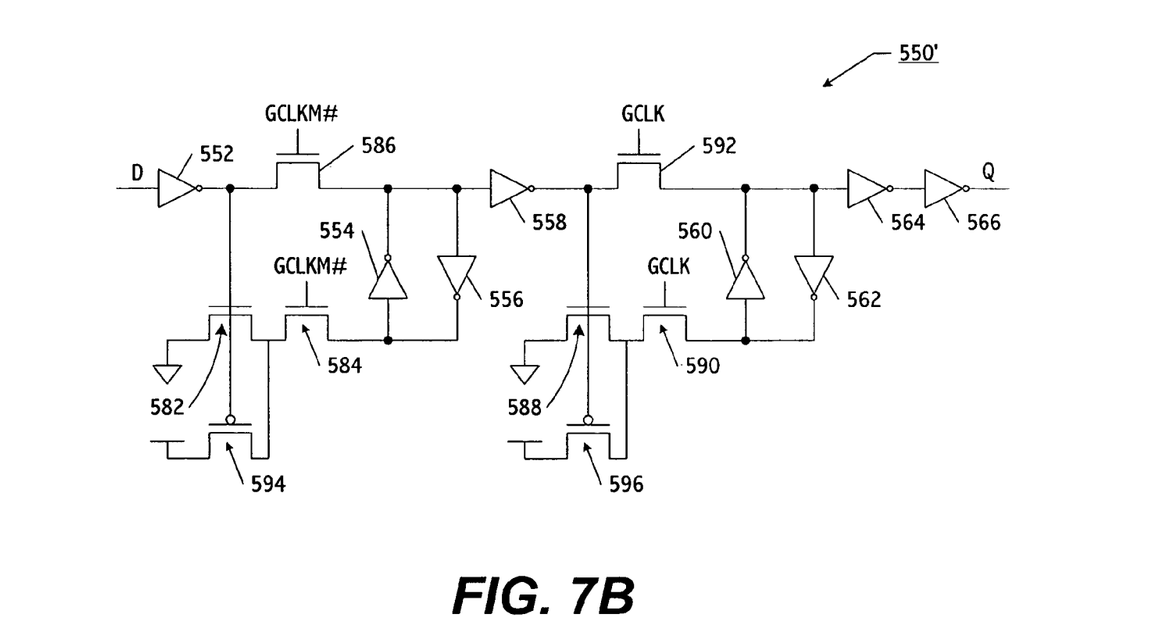
FIG. 7B illustrates a flop repeater circuit (for use with the FIG. 7A clocking circuit) according to an example embodiment of the present invention.

FIG. 7B illustrates a flop repeater circuit 550' (or flip flop repeater circuit) for use with the clocking circuit 500' according to an example embodiment of the present invention. Other embodiments and configurations are also within the scope of the present invention. The flop repeater circuit 550' shown in FIG. 7B does not include transmission gates (having the parallel NMOS and PMOS transistors) and therefore there is a significant reduction in clock capacitance as compared to the arrangement shown in FIG. 4B. More specifically, the flop repeater 550' operates without the use of full transmission gates. The flop repeater circuit 550' may include inverters (or inverter circuits) 552, 554, 556, 558, 560, 562, 564 and 566. The flop repeater circuit 550' further includes NMOS transistors 582, 584, 586, 588, 590, and 592 and PMOS transistors 594 and 596 that are coupled with the inverters as shown in FIG. 7B. The flop repeater circuit 550' does not include any full transmission gates and therefore a less number of clock signals are needed. This results in a less reduction of the clocking power as compared to arrangements that include full transmission gates.

Elements on the left hand side of FIG. 7B may be considered on the "master" side of the flop repeater circuit 550' and elements on the right hand side of FIG. 7B may be considered on the "slave" side of the flop repeater circuit 550'. Thus, the flop repeater circuit 550' acts as a master/slave D/Q flip-flop circuit. That is, data D is input to the flop repeater circuit 550' and the data Q is output from the flop repeater circuit 550' based on the clocking signals applied to the transistors without requiring full transmission gates.

The flop repeater circuit 550' operates based on various signals that are applied to the various transistors 584, 586, 590, 592, 594 and 596. These signals may be generated (or provided) by the clocking circuit 500' shown in FIG. 7A. More specifically, the transistor 584 operates based on the signal gclkm# and the transistor 586 operates based on the signal gclkm#. Furthermore, the transistor 590 operates based on the signal gclk and the transistor 592 operates based on the signal gclk. The transistors 582 and 594 operate based on a signal output from the inverter 552. Additionally, the transistors 588 and 592 operate based on a signal output from the inverter 558. Accordingly, the flop repeater circuit 550' is capable of passing signals from a D input to a Q output based on the two clock signals gclk and gclkm#. Thus, there is a reduction in the number of generated clock signals as compared to the FIG. 4A/4B example arrangement (i.e., two clock signals as compared with four clock signals). This may reduce the overall clocking power of the die as compared with the FIG. 4A/4B example arrangement.

Accordingly, the clocking circuit 500' and flop repeater circuit 550' shown in FIGS. 7A and 7B show a clock network topology. FIG. 7B includes additional PMOS transistors 594 and 596 inserted into the data path. This topology may allow a stronger write to occur as well as allow better low voltage scaling. That is, since the clock network is simpler and there is less capacitance, a more compact layout may be provided. Also, a strong uninterrupted cross-coupled storage cell may make the structure robust to noise.

The clocking circuit 500' shown in FIG. 7A may also be used with the flop repeater circuit 550 shown in FIG. 5B. Further, the clocking circuit 500 shown in FIG. 5A may also be used with the flop repeater circuit 550' shown in FIG. 7B.

Embodiments of the present invention may provide a low power repeater flip-flop circuit that may be used as a pipelined element for on-chip microprocessor busses. As stated above, a flop repeater circuit (or flip-flop circuit) may be used to synchronize the data to a clock frequency. Since many disadvantageous repeaters cannot be clock gated, and since the power used by the clock gating circuitry is more than the power saved, embodiments of the present invention may reduce the power by lowering the switching capacitance. The flop repeater circuits discussed above may eliminate the need to use PMOS transistors in a transmission gate (as in the FIG. 4B arrangement), thereby reducing the switched capacitance and enabling a dense layout.

The embodiment shown in FIGS. 5A/5B may allow for time borrowing between the master stage and the slave stage. That is, the flop repeater circuit 550 may achieve better minimal D/Q with a three inverter clock network delay (as compared with a single inverter clock network delay). Alternatively, the embodiment shown in FIGS. 7A/7D may not include time-borrowing between the master stage and the slave stage by including a single inverter. However, the single clock delay may achieve a lower clock power.

Embodiments of the present invention are not limited to the circuits discussed above. As one example, the FIG. 5B and the FIG. 7B embodiment each utilize two inverters 564, 566 at the output to buffer the signal. Additionally, the inverter 552 at the input may be used for noise reasons. These inverters are optional and/or may be replaced with logic gates, such NAND and/or NOR gates, for example. That is, embodiments of the present invention do not require the circuits to be inverter circuits as shown in the figures. Other changes of logic are also possible as would be understood to one skilled in the art.

Embodiments of the present invention may be provided within any of a number of electronic systems. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A system comprising:
   a clocking circuit to provide a first repeater clock signal and a second repeater clock signal, the clocking circuit including a plurality of inverters, a first one of the plurality of inverters to receive the first repeater clock signal and a second one of the inverters to provide the second repeater clock signal; and
   a flop repeater circuit to receive the first and second repeater clock signals and an input data signal, the flop repeater circuit to provide an output data signal based on the first and second repeater clock signals, the flop repeater circuit including a plurality of transistors and inverters coupled together without any transmission gates to function as a flip-flop circuit that passes data, the flop repeater circuit further including:
a master side to receive the input data signal and the first repeater clock signal and to provide a first signal, the master side to include a plurality of transistors to pass data based on the first repeater clock signal; and
a slave side to receive the first signal output from the master side and the second repeater clock signal and to provide an output data signal, the slave side including a plurality of transistors to pass data based on the second repeater clock signal received at the slave side.

2. The system of claim 1, wherein the clocking circuit comprises a first inverter to receive the first repeater clock signal and to provide the second repeater clock signal.

3. The system of claim 2, wherein the first repeater clock signal and the second repeater clock signal drive the transistors of the flop repeater circuit without any additional repeater clock signals to drive elements of the flop repeater circuit.

4. The system of claim 1, wherein the first repeater clock signal and the second repeater clock signal clock the transistors of the flop repeater circuit without any additional repeater clock signals to clock elements of the flop repeater circuit.

5. The system of claim 1, wherein the clocking circuit and the flop repeater circuit operate with time-borrowing of the signals.

6. The system of claim 1, further comprising:
a first interconnect coupled to an input side of the flop repeater circuit; and
a second interconnect coupled to an output side of the flop repeater circuit such that the flop repeater circuit is coupled between the first interconnect and the second interconnect.

7. The system of claim 6, further comprising a second flop repeater circuit coupled to the second interconnect, the second repeater circuit to receive the first and second repeater clock signals and a signal corresponding to the output data signal, the second flop repeater circuit to provide a further output data signal based on the first and second repeater clock signals, the second flop repeater circuit including a plurality of transistors and inverters coupled together without any transmission gates to function as a flip-flop circuit that passes data.

8. The system of claim 1, wherein the flop repeater circuit synchronizes the data to a clock frequency.

9. A flop repeater circuit comprising:
a master side to receive an input data signal and to provide a first signal, the master side to include a plurality of transistors each to receive a first repeater clock signal, the master side include two NMOS transistors without any PMOS transistors; and
a slave side to receive the first signal and to provide an output data signal, the slave side to include a plurality of transistors each to receive a second repeater clock signal, the first repeater clock signal being different than the second repeater clock signal, the slave side including two NMOS transistors without any PMOS transistors, the flop repeater circuit to operate without any transmission gates within the master side and the slave side of the flop repeater circuit.

10. The flop repeater circuit of claim 9, wherein the two NMOS transistors operate based on one repeater clock signal.

11. The flop repeater circuit of claim 9, wherein the two NMOS transistors operate based on the second repeater clock signal received by the two NMOS transistors.

12. The flop repeater circuit of claim 9, wherein the plurality of transistors of the master side operate based on only the first repeater clock signal received at the master side.

13. The flop repeater circuit of claim 9, wherein the plurality of transistors of the slave side operate based on only the second repeater clock signal received at the slave side.

14. The flop repeater circuit of claim 9, wherein the flop repeater circuit operates with time-borrowing of the signals.

15. A system comprising:
a chip having a first functional block and a second functional block coupled by an interconnect, the chip including a first repeater circuit coupled to the interconnect between the first functional block and the second functional block, the first repeater circuit to receive input data and to output data based on two repeater clock signals, the first repeater circuit including a plurality of transistors and inverters coupled together without any transmission gates to function as a flip-flop circuit that passes data, the first repeater circuit including:
a master side to receive the input data signal and to provide a first signal, the master side including a plurality of NMOS transistors each to receive a first repeater clock signal without any PMOS transistors to receive the first repeater clock signal,
a slave side to receive the first signal output from the master side and to provide the output data signal, the slave side including a plurality of NMOS transistors each to receive a second repeater clock signal without any PMOS transistors to receive the second repeater clock signal; and
a processor coupled to the chip.

16. The system of claim 15, wherein the chip includes a clocking circuit to provide the first and second repeater clock signals, the clocking circuit including a plurality of inverters, a first one of the plurality of inverters to receive a first repeater clock signal and a second one of the inverters to provide a second repeater clock signal.

17. The system of claim 15, wherein the chip further includes a second repeater circuit coupled to the interconnect, the second repeater circuit to receive the first and second repeater clock signals and a signal corresponding to the output data, the second repeater circuit to provide further output data based on the first and second repeater clock signals, the second repeater circuit including a plurality of transistors and inverters coupled together without any transmission gates to function as a flip-flop circuit that passes data.

18. The system of claim 15, wherein the master side includes two NMOS transistors without any PMOS transistors, and the slave side includes two NMOS transistors without any PMOS transistors.

19. The system of claim 1, wherein the master side includes two NMOS transistors without any PMOS transistors, and the slave side includes two NMOS transistors without any PMOS transistors.

* * * * *